United States Patent
Gu et al.

(10) Patent No.: US 12,166,481 B2
(45) Date of Patent: Dec. 10, 2024

(54) METHOD, UNIT AND CIRCUIT FOR IMPLEMENTING BOOLEAN LOGIC BASED ON COMPUTING-IN-MEMORY TRANSISTOR

(71) Applicant: ZHEJIANG LAB, Zhejiang (CN)

(72) Inventors: Jiani Gu, Hangzhou (CN); Bing Chen, Hangzhou (CN); Xiao Yu, Hangzhou (CN); Chengji Jin, Hangzhou (CN); Genquan Han, Hangzhou (CN)

(73) Assignee: ZHEJIANG LAB, Hangzhou (CN)

( * ) Notice: Subject to any disclaimer, the term of this patent is extended or adjusted under 35 U.S.C. 154(b) by 154 days.

(21) Appl. No.: 18/183,908

(22) Filed: Mar. 14, 2023

(65) Prior Publication Data

US 2023/0223939 A1 Jul. 13, 2023

Related U.S. Application Data

(63) Continuation of application No. PCT/CN2022/091442, filed on May 7, 2022.

(30) Foreign Application Priority Data

Jan. 10, 2022 (CN) .......................... 202210021493.1

(51) Int. Cl.
*G11C 11/419* (2006.01)
*H03K 19/08* (2006.01)
(Continued)

(52) U.S. Cl.
CPC ............. *H03K 19/08* (2013.01); *H03K 19/21* (2013.01); *G11C 11/223* (2013.01)

(58) Field of Classification Search
CPC ....... G11C 11/223; H03K 19/08; H03K 19/21
See application file for complete search history.

(56) References Cited

U.S. PATENT DOCUMENTS

| 10,033,383 B1 * | 7/2018 | Richter ............. H01L 29/78391 |
| 2019/0172539 A1 * | 6/2019 | Slesazeck ............. G11C 11/223 |

(Continued)

FOREIGN PATENT DOCUMENTS

| CN | 111309670 A | 6/2020 |
| CN | 111817710 A | 10/2020 |

(Continued)

OTHER PUBLICATIONS

Japanese Office Action for Application No. 2023-524981, mailed Apr. 30, 2024 (7 pages).

(Continued)

*Primary Examiner* — Kurtis R Bahr
(74) *Attorney, Agent, or Firm* — W&G Law Group (57) ABSTRACT

A method, a unit and circuits for implementing Boolean logics based on computing-in-memory transistors. The method is implemented by using the characteristics and the read-write mode of the computing-in-memory transistor; the basic unit consists of a computing-in-memory transistor and a pull resistor; the pull resistor in the basic unit is connected in series with the transistor, and the gate of the transistor is independent; the basic units can implement sixteen Boolean logic operations through different circuit structures and voltage configuration schemes. Compared with the logic circuit structure of the conventional CMOS transistors, the present disclosure can implement more logic operations with fewer transistors, which greatly optimizes circuit density and computing speed caused by data transmission between storage units and process units.

9 Claims, 4 Drawing Sheets

(51) Int. Cl.
    *H03K 19/21* (2006.01)
    *G11C 11/22* (2006.01)

(56) References Cited

U.S. PATENT DOCUMENTS

| | | | | |
|---|---|---|---|---|
| 2021/0110876 | A1* | 4/2021 | Seo | G06F 13/1668 |
| 2021/0312959 | A1* | 10/2021 | Shan | G06N 3/048 |
| 2022/0115059 | A1* | 4/2022 | Li | G11C 8/16 |
| 2022/0230679 | A1* | 7/2022 | Mirhaj | G11C 11/419 |
| 2022/0271756 | A1* | 8/2022 | Fan | H03K 17/62 |

FOREIGN PATENT DOCUMENTS

| | | |
|---|---|---|
| CN | 111898329 A | 11/2020 |
| CN | 112636745 A | 4/2021 |
| CN | 113472343 A | 10/2021 |
| CN | 114024546 A | 2/2022 |
| JP | 2003179485 A | 6/2003 |
| JP | 2005012210 A | 1/2005 |
| WO | 2003065582 A1 | 8/2003 |
| WO | 2004086625 A1 | 10/2004 |

OTHER PUBLICATIONS

International Search Report (PCT/CN2022/091442); Date of Mailing: Oct. 10, 2022.
CN First Office Action(CN202210021493.1); Date of Mailing: Feb. 21, 2022.
CN Notice Of Allowance(CN202210021493.1); Date of Mailing: Apr. 1, 2022.
Reconfigurable-NAND/NOR-logic-gates-in-28-nm-HKMG-and-22-nm-FD-SOI-FeFET-technology.
Prospects-for-energy-efficient-edge-computing-with-integrated-HfO2-based-ferroelectric-devices.
Design-and-Simulation-of-FeFET-based-Lookup-Table.

* cited by examiner

METHOD, UNIT AND CIRCUIT FOR IMPLEMENTING BOOLEAN LOGIC BASED ON COMPUTING-IN-MEMORY TRANSISTOR

CROSS-REFERENCE TO RELATED APPLICATIONS

The present application is a continuation of International Application No. PCT/CN2022/091442, filed on May 7, 2022, which claims priority to Chinese Application No. 202210021493.1, filed on Jan. 10, 2021, the contents of both of which are incorporated herein by reference in their entireties.

TECHNICAL FIELD

The present disclosure belongs to the technical field of semiconductors and integrated circuits, and in particular relates to a method, a unit and circuits for implementing Boolean logic based on computing-in-memory transistors.

BACKGROUND

In the traditional computing system based on the Von Neumann architecture, the data need to be frequently transmitted between the process unit and the storage unit due to the physical separation, resulting in serious loss of system power consumption and speed. The improvement of memory performance lags far behind that of CPU, and the performance gap between them keeps widening, which limits the development of high-speed and low-power processors. At the same time, applications such as artificial intelligence and brain-like computing with high memory access and high parallelism are accelerating the development of in-memory computing.

The computing-in-memory transistor has the advantages of high speed, low power consumption, high integration density and non-destructive readout. At the same time, this kind of device can implement non-volatile storage of data by adjusting the polarization of the gate material, which is helpful to accelerate the application of in-memory computing.

Therefore, the implementation of data storage and process by using the computing-in-memory transistors plays an important role in realizing the new computing architecture, improving the computing speed and energy efficiency, and increasing the integrated-circuit density.

SUMMARY

In view of the deficiency of the separation between the storage and process in Von Neumann architecture in the prior art, the purpose of the present disclosure is to provide a method, a unit and circuits for implementing Boolean logic based on computing-in-memory transistors. In the present disclosure, the non-volatile computing-in-memory transistor is used to implement in-memory Boolean logic, which can reduce the circuit area and optimize the power consumption of data transmission.

The purpose of the present disclosure is implemented by the following technical solution: an in-memory computing basic unit consists of a computing-in-memory transistor and a pull resistor. The pull resistor is connected in series with the computing-in-memory transistor, and the gate of the computing-in-memory transistor is independent; one end of the pull resistor is connected with the drain of computing-in-memory transistor, the other end of the pull resistor which is not connected to the computing-in-memory transistor is a port T1, and the source of the computing-in-memory transistor is connected to the port T2; a threshold voltage $V_t$ of the computing-in-memory transistor represents an input A of the basic unit; a gate voltage $V_{in}$ of the computing-in-memory transistor represents an input B of the basic unit; A and B are serial inputs; a drain voltage of the computing-in-memory transistor is an output $V_{out}$ of the basic unit.

Further, the gate voltage $V_{in}$ and the threshold voltage $V_t$ of the computing-in-memory transistor satisfy the following relationship:

$$V_{t+} > V_{in+} > V_{t0} > V_{in-} > V_{t-}$$

where the gate voltage $V_{in}$ is modulated between $V_{in+}$ and $V_{in-}$, and the threshold voltage $V_t$ is modulated between $V_{t+}$, $V_{t0}$ and $V_{t-}$.

A method for implementing Boolean logic based on computing-in-memory transistors implements 10 kinds of Boolean logics: 1, 0, A, B, $\overline{A}$, $\overline{B}$, AB, A+B, $\overline{AB}$, $\overline{A+B}$ by a single basic unit as described above; the threshold voltage modulation of the computing-in-memory transistor can change the AND/OR logic relationship of A and B, and the configuration scheme of the port voltages of the basic unit determines whether the circuit has a NOT gate function.

Further, the method includes the following steps.

a) When the port T1 is grounded and the voltage of the port T2 is $V_{dd}$, the threshold voltage of the computing-in-memory transistor is $V_{t0}$, the logic operation of 0 or 1 is complemented by modulating the gate voltage: when the applied gate voltage is $V_{in+}$, which is greater than the threshold voltage $V_{t0}$, the output is 1; when the applied gate voltage is $V_{in-}$, which is less than the threshold voltage $V_{t0}$, the output is 0;

b) When the output is irrelated to B, the gate voltage of the computing-in-memory transistor is $V_{in+}$, and the threshold voltage is $V_{t+}/V_{t-}$, the logic operation of A is implemented, the logic value of A is related with the modulation of the threshold voltage: when the threshold voltage is $V_{t+}$, which is greater than the gate voltage $V_{in+}$, the logic value of A is 0; when the threshold voltage is $V_{t-}$, which is less than the gate voltage the logic value of A is 1; the logic operation of A is implemented by adjusting the port voltage which can configure the NOT gate function.

c) When the output is irrelated to A, the threshold voltage of the computing-in-memory transistor is $V_{t0}$, and the gate voltage is $V_{in+}/V_{in-}$, the logic operation of B is implemented, the logic value of B is related with the modulation of the gate voltage: when the gate voltage is $V_{in+}$, which is greater than the threshold voltage $V_{t0}$, the logic value of B is 1; when the gate voltage is $V_{in-}$, which is less than the threshold voltage $V_{t0}$, the logic value of B is 0; the logic operation of 173 is implemented by adjusting the port voltage which can configure the NOT gate function.

d) When the output is related to both A and B, the applied gate voltage is $V_{in+}/V_{in-}$ (i.e. the logic value of B is 1/0):

d1) When the threshold voltage is $V_{t+}/V_{t0}$ (i.e. the logic value of A is 1/0), two logic operations of $\overline{AB}$, AB are implemented by adjusting the port voltage which can configure the NOT gate function.

d2) When the threshold voltage is $V_{t0}/V_{t-}$ (i.e. the logic value of A is 1/0), two logic operations of $\overline{A+B}$, A+B can be implemented by adjusting the port voltage which can configure the NOT gate function.

Further, the NOT gate function is configurable by adjusting the port voltage. It includes: when the port T1 is grounded and the voltage of port T2 is $V_{dd}$, the basic unit has no NOT gate function; when the voltage of port T1 is $V_{dd}$ and port T2 is grounded, the basic unit has the NOT gate function.

An in-memory computing logic circuit based on computing-in-memory transistors consists of two basic units in cascade, and the output port of the upper-stage basic unit is connected to the gate of the lower-stage basic unit.

The threshold voltage $V_{t1}$ of the upper-stage computing-in-memory transistor is $V_0$, and the gate voltage $V_{in1}$ of the upper-stage computing-in-memory transistor is an input B of the logic circuit; the gate voltage $V_{in2}$ of the lower-stage computing-in-memory transistor is the output voltage $V_{t1}$ from the upper-stage basic unit; the threshold voltage $V_{t2}$ of the lower-stage computing-in-memory transistor is an input A of the logic circuit; the output $V_{out2}$ of the lower-stage basic unit is the output of the logic circuit; one end of the upper-stage pull resistor, which does not output $V_{out1}$, is a port T1, and the source of the upper-stage computing-in-memory transistor is connected to the port T2; one end of the lower-stage pull resistor, which does not output $V_{out2}$, is a port T3, and the source of the lower-stage computing-in-memory transistor is connected to the port T4.

A method for implementing Boolean logic based on computing-in-memory transistors whose output logic is related to both A and B, implements four Boolean logics of A+B, A+B, AB, AB by the above logic circuit, includes:

The voltage of port T1 is $V_{dd}$, the port T2 is grounded, and the gate voltage $V_{m1}$ of the upper-stage computing-in-memory transistor is $V_{in+}/V_{in-}$, the upper-stage basic unit has the NOT gate function at this time, and its output $V_{out1}$ is B; the logic operations of A$\overline{\text{B}}$, A+$\overline{\text{B}}$ are implemented by modulating the threshold voltage of the lower-stage computing-in-memory transistor; the configuration scheme of the port voltages of the lower-stage basic unit (i.e. T3, T4) determines whether to perform the NOT operation on the logic operations of A$\overline{\text{B}}$, A+$\overline{\text{B}}$:

e) When the port T3 is grounded, the voltage of port T4 is $V_{dd}$, and the threshold voltage $V_{t2}$ of the lower-stage computing-in-memory transistor is $V_{t+}/V_{t0}$, the logic operation of A$\overline{\text{B}}$ is implemented.

f) When the port T3 is grounded, the voltage of port T4 is $V_{dd}$, and the threshold voltage $V_{t2}$ of the lower-stage computing-in-memory transistor is $V_{t0}/V_{t-}$, the logic operation of A+11 is implemented.

g) When the voltage of port T3 is $V_{dd}$, the port T4 is grounded, and the threshold voltage $V_{t2}$ of the lower-stage computing-in-memory transistor is $V_+/V_{t0}$, the logic operation of $\overline{\text{A}}$+B is implemented.

h) When the voltage of port T3 is $V_{dd}$, the port T4 is grounded, and the threshold voltage $V_2$ of the lower-stage computing-in-memory transistor is $V_{t0}/V_{t-}$, the logic operation of $\overline{\text{AB}}$ is implemented.

An in-memory computing logic circuit based on the computing-in-memory transistors includes three basic units mentioned above; the drain of the first-stage computing-in-memory transistor is connected with the gate of the second-stage computing-in-memory transistor, so that the first-stage basic unit is cascaded with the second-stage basic unit; the second-stage basic unit and the third-stage basic unit share a pull resistor, the drain of the second-stage computing-in-memory transistor is connected with the drain of the third-stage computing-in-memory transistor, and the source of the second-stage computing-in-memory transistor is connected with the source of the third-stage computing-in-memory transistor, so that the second-stage basic unit and the third-stage basic unit are connected in parallel; the gate of the first-stage computing-in-memory transistor and the gate of the third-stage computing-in-memory transistor are input ports of the in-memory computing logic circuit; the drain voltage of the third-stage computing-in-memory transistor is the output of the in-memory computing logic circuit.

A method for implementing Boolean logic based on computing-in-memory transistors can implements two logic operations of XNOR (AB+$\overline{\text{AB}}$) and XOR ($\overline{\text{A}}$B+A$\overline{\text{B}}$), includes:

The threshold voltage of the first-stage computing-in-memory transistor is $V_{t0}/V_{t-}$ (i.e. the logic value is 1/0); the threshold voltage of the second-stage computing-in-memory transistor is $V_{t0}$, the threshold voltage of the third-stage computing-in-memory transistor is $V_{t+}/V_{t0}$ (i.e. the logic value is 1/0); the first-stage basic unit implements the logic operation of NOR. The threshold voltage of the first-stage computing-in-memory transistor and the threshold voltage of the third-stage computing-in-memory transistor correspond to the same logic value, which are denoted by A; the gate voltage of the first-stage computing-in-memory transistor and the gate voltage of the third-stage computing-in-memory transistor correspond to the same logic value, which are denoted by B.

When the port connected with the pull resistor of the parallel structure and the source of the first-stage computing-in-memory transistor are grounded, meanwhile, the source of the computing-in-memory transistor of the parallel structure and the port connected to the first-stage pull resistor are connected to $V_{dd}$, the logic circuit implements the logic operation of XNOR (i.e. AB+$\overline{\text{AB}}$ ); when the source of the computing-in-memory transistor of the parallel structure and the source of the first-stage computing-in-memory transistor are grounded, meanwhile, the port connected to the pull resistor of the parallel structure and the port connected with the first-stage pull resistor are connected to $V_{dd}$, the logic circuit implements the logic operation of XOR (i.e. $\overline{\text{A}}$B+A$\overline{\text{B}}$).

The present disclosure has the following beneficial effects: on the basis of storing data in computing-in-memory transistors, the present disclosure not only can implement Boolean logic operations by using fewer transistors, but also reduce the circuit area and optimize the power consumption of data transmission, which can greatly improve the computing speed and energy efficiency.

DESCRIPTION OF EMBODIMENTS

The technical solutions in the embodiments of the present disclosure will be clearly and completely described below with reference to the drawings in the embodiments of the present disclosure. The described embodiments are only some of the possible embodiments of the present disclosure, but not all of them. They are intended to provide a basic understanding of the present disclosure, and are not intended to confirm the key or decisive elements of the present disclosure or limit the scope to be protected. It is easy to understand that, according to the technical solutions of the present disclosure, a general technical personnel in this filed can propose other alternative implementations without changing the essential spirit of the present disclosure. Therefore, the following detailed description and drawings are only examples of the technical solutions of the present disclosure, and should not be regarded as the whole solutions of the present disclosure or as a limitation of the technical solutions of the present disclosure.

The present disclosure relates to a method, a unit and circuits for implementing Boolean logic based on computing-in-memory transistors, which implements the Boolean logic operations by using the characteristics and the read-write mode of the computing-in-memory transistors. The basic unit of the present disclosure consists of a pull resistance and a computing-in-memory transistor whose threshold voltage can be controlled by the external physical field; the threshold voltage and gate voltage of the computing-in-memory transistor represent inputs A and B respectively, A and B are serial inputs. The pull resistor in the basic unit is connected in series with the computing-in-memory transistor, and the gate of the transistor is independent. The basic units can implement sixteen kinds of basic Boolean logic operations through different circuit structures and configuration schemes of port voltage: one basic unit described above can implement ten kinds of basic Boolean logics: 1, 0, A, B, $\overline{A}$, $\overline{B}$, AB, A+B, $\overline{AB}$ and $\overline{A+B}$, and modulating the threshold voltage of the computing-in-memory transistor can change the AND/OR logic relationship of A and B, the configuration scheme of the port voltages of the basic unit determines whether it has the NOT-gate function; four kinds of logic operations can be implemented through the cascade of two basic units described above, and the cascade mode is that the output port of the previous-stage basic unit is connected with the gate of the next-stage basic unit, this circuit structure can implement four logic operations of A+$\overline{B}$, $\overline{A}$+B, A$\overline{B}$ and $\overline{A}$B; two logic operations of XNOR (AB+$\overline{AB}$) and XOR ($\overline{A}$B+A$\overline{B}$) can be implemented through the combination of the cascade circuit.

Figure 1:
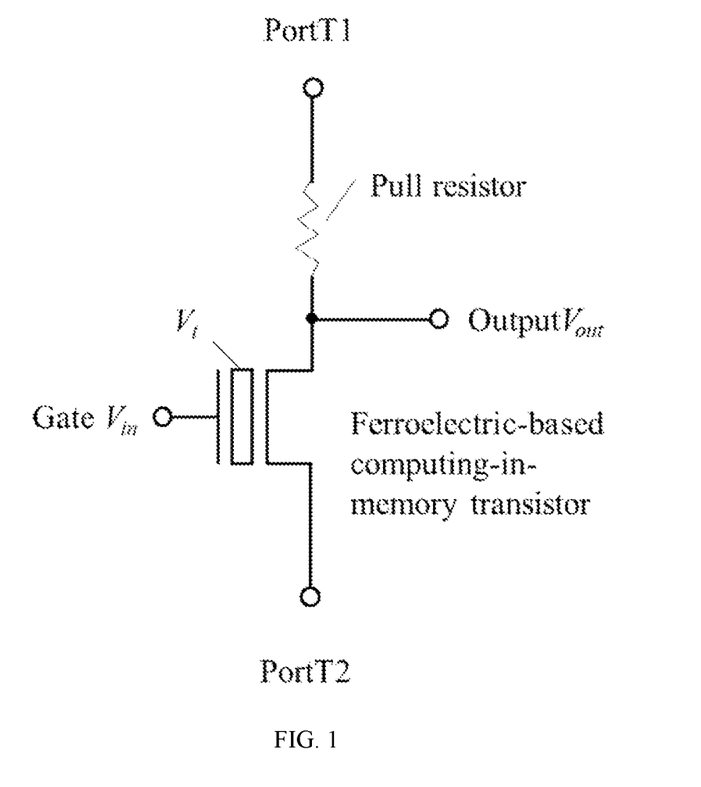
FIG. 1 is a logic circuit structure diagram of an in-memory computing basic unit according to the present disclosure.

As shown in FIG. 1, an in-memory computing basic unit of the present disclosure consists of a pull resistor and a computing-in-memory transistor; the threshold voltage $V_t$ of the computing-in-memory transistor can be controlled by an external physical field, and logic information can be stored by adjusting the input of the threshold voltage. The pull resistor is connected in series with the transistor, and the gate of the transistor is independent. The drain of the computing-in-memory transistor is connected with one end of the pull resistor, and the drain voltage $V_t$ is used as the logic output of the basic unit; the other end of the pull resistor is connected to the port T1, and the source of the computing-in-memory transistor is connected to the port T2. This embodiment adopts ferroelectric-based computing-in-memory transistor.

The threshold voltage $V_t$ of the ferroelectric-based computing-in-memory transistor represents the input A ($V_t$ can be modulated between $V_{t+}$, $V_{t0}$ and $V_{t-}$); the gate voltage $V_{in}$ represents the input B ($V_{in}$ can be modulated between $V_{in+}$ and $V_{in-}$). A and B are serial inputs, and modulating the threshold voltage $V_t$ of the transistor can implement the logic operation of AND/OR between A and B; In this embodiment, the threshold voltage of the ferroelectric-based computing-in-memory transistor is firstly modulated to realize the input of the value A, and then the gate voltage is applied to realize the input of the value B. Different configuration schemes of port voltages can decide whether to implement the NOT-gate function.

The threshold voltage $V_t$ and the gate voltage $V_{in}$ satisfy the following relationship:

$$V_{t+}>V_{in+}>V_{t0}>V_{in-}>V_{t-}$$

where the gate voltage $V_{in}$ is modulated between $V_{in+}$ and $V_{in-}$, and the threshold voltage $V_t$ is modulated between $V_{t+}$, $V_{t0}$ and $V_{t-}$; $V_{t0}$ is the threshold voltage before applying the pulse of programming or erasing. When the gate voltage $V_{in}$ is greater than the threshold voltage $V_t$, the transistor is turned on (the logic output is 1); when the gate voltage $V_{in}$ is less than the threshold voltage $V_t$, the transistor is turned off (the logic output is 0).

The present disclosure relates to a method for implementing logic operations based on a single in-memory computing basic unit, which implements ten kinds of Boolean logics through the voltage configuration of the in-memory computing basic unit (according to Table 1), including: 1, 0, A, B, $\overline{A}$, $\overline{B}$, AB, A+B, $\overline{AB}$, $\overline{A+B}$.

a) When the port T1 is grounded and the voltage of the port T2 is $V_{dd}$, the threshold voltage of the ferroelectric-based computing-in-memory transistor is $V_{t0}$, the logic operation of 0 or 1 is complemented by modulating the gate voltage: when an applied gate voltage is $V_{in+}$, which is greater than the threshold voltage $V_{t0}$, the output is 1; when the applied gate voltage is $V_{in-}$, which is less than the threshold voltage $V_{t0}$, the output is 0;

b) When the output is irrelated to B, the gate voltage of the ferroelectric-based computing-in-memory transistor is $V_{in+}$ and the threshold voltage is $V_{t+}/V_{t-}$, the logic operation of A is implemented, the logic value of A is related with the modulation of the threshold voltage: when the threshold voltage is $V_{t+}$, which is greater than the gate voltage $V_{in+}$, the logic value of A is 0; when the threshold voltage is $V_{t-}$, which is less than the gate voltage $V_{in+}$, the logic value of A is 1; the logic operation of $\overline{A}$ is implemented by adjusting the port voltage: when the port T2 is grounded and the voltage of the port T1 is $V_{dd}$, the NOT gate function can be achieved, and the output of Boolean logic is $\overline{A}$;

c) When the output is irrelated to A, the threshold voltage of the ferroelectric-based computing-in-memory transistor is $V_{t0}$, and the gate voltage is $V_{in+}/V_{in-}$, the logic operation of B is implemented, the logic value of B is related with the modulation of the gate voltage: when the gate voltage is $V_{in+}$, which is greater than the threshold voltage $V_{t0}$, the logic value of B is 1; when the gate voltage is $V_{in-}$, which is less than the threshold voltage $V_{t0}$, the logic value of B is 0; the logic operation of B is implemented by adjusting the port voltage: when the port T2 is grounded and the voltage of the port T1 is $V_{dd}$, the NOT gate function can be achieved, the output of Boolean logic is 173;

d) When the output is related to both A and B, the applied gate voltage is $V_{in+}/V_{in-}$ (i.e. the logic value of B is 1/0):

d1) When the threshold voltage is $V_{t+}/V_{t0}$ (i.e. the logic value of A is 1/0), two logic operations of $\overline{AB}$, AB are implemented by adjusting the port voltage: when the port T1 is grounded and the voltage of the port T2 is $V_{dd}$, the output of Boolean logic is AB; when the port T2 is grounded and the voltage of the port T1 is $V_{dd}$, the NOT gate function can be achieved, the output of Boolean logic is $\overline{AB}$;

d2) When the threshold voltage is $V_{t0}/V_{t-}$ (i.e. the logic value of A is 1/0), two logic operations of $\overline{A+B}$, A+B can be implemented by adjusting the port voltage: when the port T1 is grounded and the voltage of the port T2 is $V_{dd}$, the output of Boolean logic is A+B; when the port T2 is grounded and the voltage of the port T1 is $V_{dd}$, the NOT gate function can be achieved, the output of Boolean logic is $\overline{A+B}$.

TABLE 1

Configuration schemes of ten Boolean logic operations with adjustable port voltage, gate voltage and threshold voltage

|  |  | Port voltage, Gate voltage, Threshold voltage | | | |
|---|---|---|---|---|---|
|  |  | T1 | T2 | $V_{in}$ | $V_t$ |
| Boolean logics | 0 | GND | $V_{dd}$ | $V_{in-}$ | $V_{t0}$ |
|  | 1 | GND | $V_{dd}$ | $V_{in+}$ | $V_{t0}$ |
|  | A | GND | $V_{dd}$ | $V_{in+}$ | $V_{t+}/V_{t-}$ (0/1) |
|  | B | GND | $V_{dd}$ | $V_{in+}/V_{in-}$ (1/0) | $V_{t0}$ |
|  | $\overline{A}$ | $V_{dd}$ | GND | $V_{in+}$ | $V_{t+}/V_{t-}$ (0/1) |
|  | $\overline{B}$ | $V_{dd}$ | GND | $V_{in+}/V_{in-}$ (1/0) | $V_{t0}$ |
|  | AB | GND | $V_{dd}$ | $V_{in+}/V_{in-}$ (1/0) | $V_{t+}/V_{t0}$ (0/1) |
|  | A + B | GND | $V_{dd}$ | $V_{in+}/V_{in-}$ (1/0) | $V_{t0}/V_{t-}$ (0/1) |
|  | $\overline{AB}$ | $V_{dd}$ | GND | $V_{in+}/V_{in-}$ (1/0) | $V_{t+}/V_{t0}$ (0/1) |
|  | $\overline{A+B}$ | $V_{dd}$ | GND | $V_{in+}/V_{in-}$ (1/0) | $V_{t0}/V_{t-}$ (0/1) |

Taking the implementation of the logic output $\overline{A+B}$ as an example, specifically, according to the value of the input A, the threshold voltage $V_t$ of the ferroelectric-based computing-in-memory transistor is set to $V_{t0}$ or $V_{t-}$ (i.e. the logic value of A is 0 or 1). According to the value of the input B, the gate voltage is set to $V_{in+}$ or $V_{in-}$ (i.e. logic value of B is 1 or 0). Table 2 shows the Karnaugh map of the logical functions between A and B, and it can be deduced that the logic output is A+B. On this basis, the logic operation of $\overline{A+B}$ can be implemented by adjusting the port voltage: when the port T2 is grounded and the voltage of the port T1 is $V_{dd}$, the NOT gate function can be achieved, and the logic output is $\overline{A+B}$.

TABLE 2

Karnaugh map of logical functions between A and B

|  |  | B | |
|---|---|---|---|
|  |  | 0 ($V_{in-}$) | 1 ($V_{in+}$) |
| A | 0 ($V_{t0}$) | 0 ($V_{t0} > V_{in-}$) | 1 ($V_{t0} < V_{in+}$) |
|  | 1 ($V_{t-}$) | 1 ($V_{t-} < V_{in-}$) | 1 ($V_{t-} < V_{in+}$) |

Figure 2:
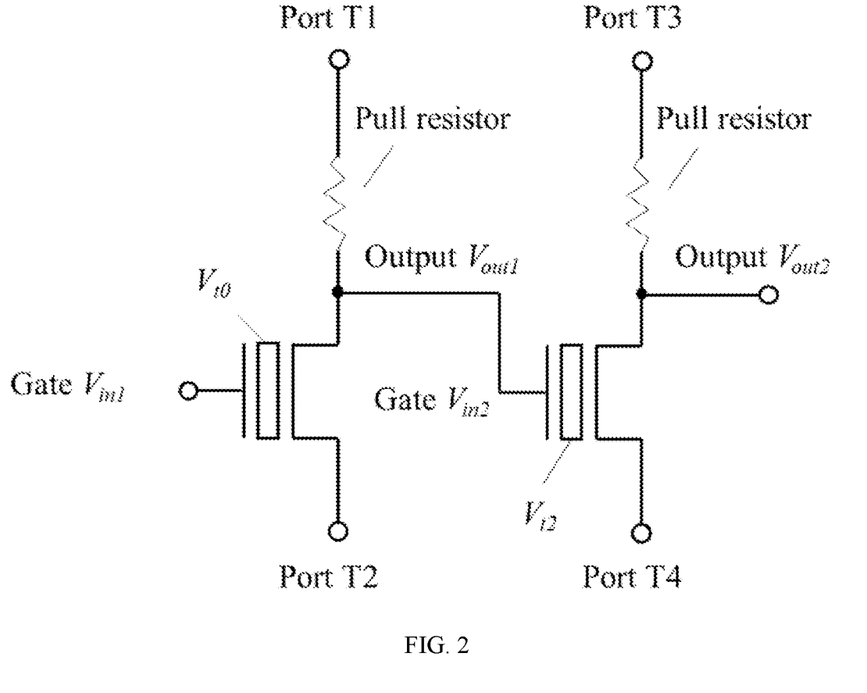
FIG. 2 is a structural diagram of a logic circuit consisting of basic units in cascade according to the present disclosure.

As shown in FIG. 2, the logic circuit of the present disclosure consists of two in-memory computing basic units in cascade, which can implement more logic operations; the output port of the upper-stage basic unit is connected to the gate of the lower-stage basic unit. The threshold voltage $V_{t1}$ of the upper-stage ferroelectric-based computing-in-memory transistor is $V_{t0}$, and the gate voltage $V_{ii}$ is a logic input B. The gate voltage $V_{in2}$ of the lower-stage ferroelectric-based computing-in-memory transistor is the output voltage $V_{out1}$ of the upper-stage basic unit; the threshold voltage $V_{t2}$ of the lower-stage ferroelectric-based computing-in-memory transistor is a logic input A, and the drain voltage $V_{out2}$ is taken as the output of the logic circuit. One end of the upper-stage pull resistor, which does not output $V_{out1}$, is a port T1, and the source of the upper-stage computing-in-memory transistor is connected to the port T2; one end of the lower-stage pull resistor, which does not output $V_{out2}$, is a port T3, and the source of the lower-stage computing-in-memory transistor is connected to the port T4.

When the voltage of port T1 is $V_{dd}$, and the port T2 is grounded, the upper-stage basic unit has the NOT gate function.

The present disclosure relates to a method for implementing Boolean logic operation based on two cascaded in-memory computing basic units. The logic output is related to both A and B, and four Boolean logic operations are implemented according to Table 3.

The voltage of port T1 is $V_{dd}$, the port T2 is grounded, and the gate voltage $V_{in1}$ of the upper-stage computing-in-memory transistor is $V_{in+}/V_{in-}$, an upper-stage basic unit has the NOT gate function at this time, and its output $V_{out1}$ is $\overline{B}$; by modulating the threshold voltage of the lower-stage computing-in-memory transistor, logic operations of $A\overline{B}$, $A+\overline{B}$ are implemented; the configuration scheme of the port voltages of the lower-stage basic unit (i.e. T3, T4) determines whether to perform the NOT operation on the logic operations of $A+\overline{B}$:

e) When the port T3 is grounded, the voltage of port T4 is $V_{dd}$, and the threshold voltage $V_{t2}$ of the lower-stage computing-in-memory transistor is $V_{t+}/V_{t0}$, the logic operation of AB can be implemented;

f) When the port T3 is grounded, the voltage of port T4 is $V_{dd}$, and the threshold voltage $V_{t2}$ of the lower-stage computing-in-memory transistor is $V_{t0}/V_{t-}$, the logic operation of A+173 can be implemented;

g) When the voltage of port T3 is $V_{dd}$, the port T4 is grounded, and the threshold voltage $V_{t2}$ of the lower-stage computing-in-memory transistor is $V_{t+}/V_{t0}$, the logic operation of $\overline{A+B}$ can be implemented;

h) When the voltage of port T3 is $V_{dd}$, the port T4 is grounded, and the threshold voltage $V_{t2}$ of the lower-stage computing-in-memory transistor is $V_{t0}/V_{t-}$, the logic operation of $\overline{AB}$ can be implemented.

TABLE 3

Configuration schemes for implementing four kinds of Boolean logics through the cascade of two basic units

|  |  | Boolean logics | | | |
|---|---|---|---|---|---|
|  |  | $A + \overline{B}$ | $\overline{A} + B$ | $A\overline{B}$ | $\overline{A}B$ |
| Port voltage, | T1 | $V_{dd}$ | $V_{dd}$ | $V_{dd}$ | $V_{dd}$ |
| Gate voltage, | T2 | GND | GND | GND | GND |
| Threshold voltage | T3 | GND | $V_{dd}$ | GND | $V_{dd}$ |
|  | T4 | $V_{dd}$ | GND | $V_{dd}$ | GND |
|  | $V_{in1}$ | $V_{in+}/V_{in-}$ | $V_{in+}/V_{in-}$ | $V_{in+}/V_{in-}$ | $V_{in+}/V_{in-}$ |
|  | $V_{in2}$ | $V_{out1}$ | $V_{out1}$ | $V_{out1}$ | $V_{out1}$ |
|  | $V_{t1}$ | $V_{t0}$ | $V_{t0}$ | $V_{t0}$ | $V_{t0}$ |
|  | $V_{t2}$ | $V_{t0}/V_{t-}$ | $V_{t+}/V_{t0}$ | $V_{t+}/V_{t0}$ | $V_{t0}/V_{t-}$ |

Taking the implementation of the logic output AB as an example, specifically, a voltage $V_{dd}$ is applied to port T1 and port T4 respectively, the port T2 and port T3 are grounded; the gate voltage $V_{in1}$ of the upper-stage ferroelectric-based computing-in-memory transistor is set to $V_{in+}$ or $V_{in-}$, when the threshold voltage $V_{t1}$ is modulated to $V_{t0}$, the output $V_{out1}$ of the upper-stage basic unit is 11; when the threshold voltage $V_{t2}$ of the lower-stage basic unit is modulated to $V_{t+}$ or $V_{t0}$, the AND gate function is implemented, and the output of logic circuit is AB.

Figure 3:
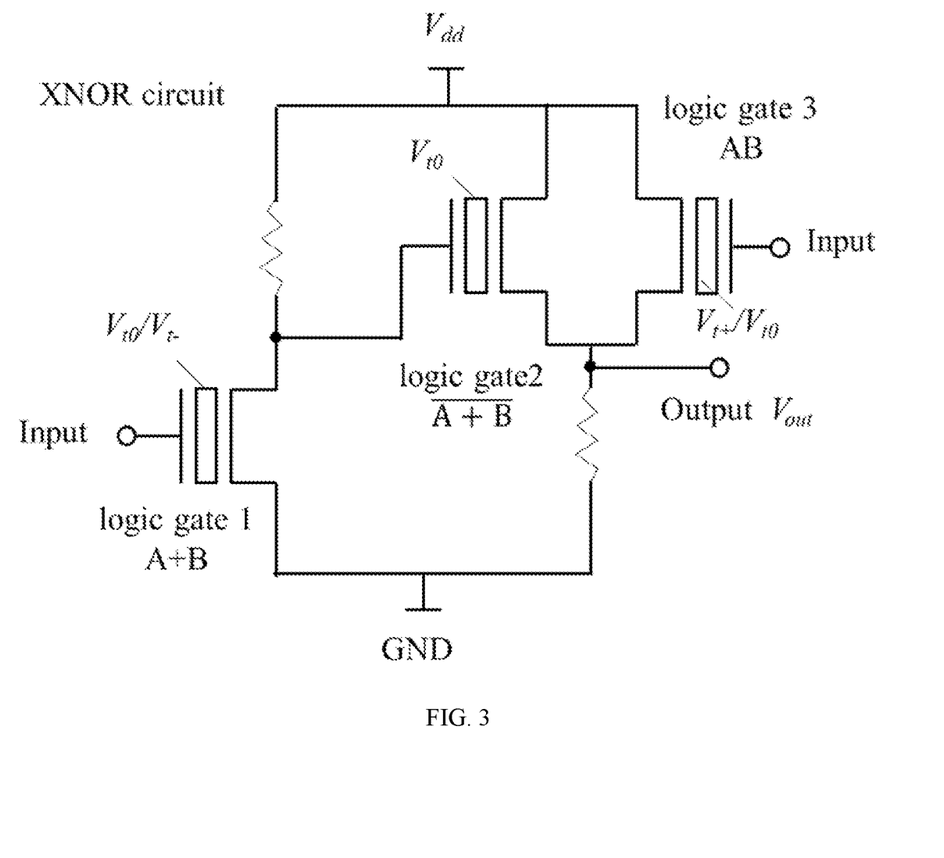
FIG. 3 is a structure diagram of an XNOR circuit consisting of cascaded and parallel basic units according to the present disclosure.

As shown in FIG. 3, the present disclosure provides an XNOR circuit consisting of three basic units in cascade and parallel connection. The drain of the first-stage computing-in-memory transistor is connected with the gate of the second-stage basic unit, so that the first-stage basic unit is cascaded with the second-stage basic unit; the second-stage basic unit and the third-stage basic unit share a pull resistor, the drain of the second-stage computing-in-memory transistor is connected with the drain of the third-stage computing-in-memory transistor, and the source of the second-stage computing-in-memory transistor is connected with the source of the third-stage computing-in-memory transistor, so that the second-stage basic unit and the third-stage basic unit are connected in parallel. The gate of the first-stage computing-in-memory transistor and the gate of the third-stage computing-in-memory transistor are input ports of the in-memory computing logic circuit; the drain voltage of the third-stage computing-in-memory transistor is an output of the in-memory computing logic circuit. The threshold voltage of the first-stage computing-in-memory transistor and the threshold voltage of the third-stage computing-in-memory transistor correspond to the same logic value, which are denoted by A; the gate voltage of the first-stage computing-in-memory transistor and the gate voltage of the third-stage computing-in-memory transistor correspond to the same logic value, which are denoted by B.

For the ferroelectric-based computing-in-memory transistor of the first-stage basic unit, the gate voltage is set to $V_{in+}/V_{in-}$, and the threshold voltage is set to $V_{t0}/V_{t-}$, so that the logic gate 1 is A+B.

When the source of the first-stage basic unit is grounded and the port voltage of the first-stage pull resistor is $V_{dd}$, the NOR operation ($\overline{A+B}$) can be implemented. Seeing Table 1 for specific operating conditions.

The output voltage of the ferroelectric-based computing-in-memory transistor of the first-stage basic unit is the gate input of the second-stage basic unit; the threshold voltage of the ferroelectric-based computing-in-memory transistor of the second-stage basic unit is set to $V_{t0}$, which implements the function of the input transmission, that is, the logic gate 2 is $\overline{A+B}$.

When the threshold voltage of the ferroelectric-based computing-in-memory transistor of the third-stage basic unit is set to $V_{t+}/V_{t0}$, the logic gate 3 implements the logic operation of AB.

The second-stage basic unit is connected in parallel with the third-stage basic unit, this parallel structure can implement OR logic operation of the logic gate 2 and logic gate 3.

Therefore, the whole circuit structure implements the XNOR logic operation, and the logic expression is: $\overline{A+B}$ +AB=$\overline{AB}$ +AB.

Figure 4:
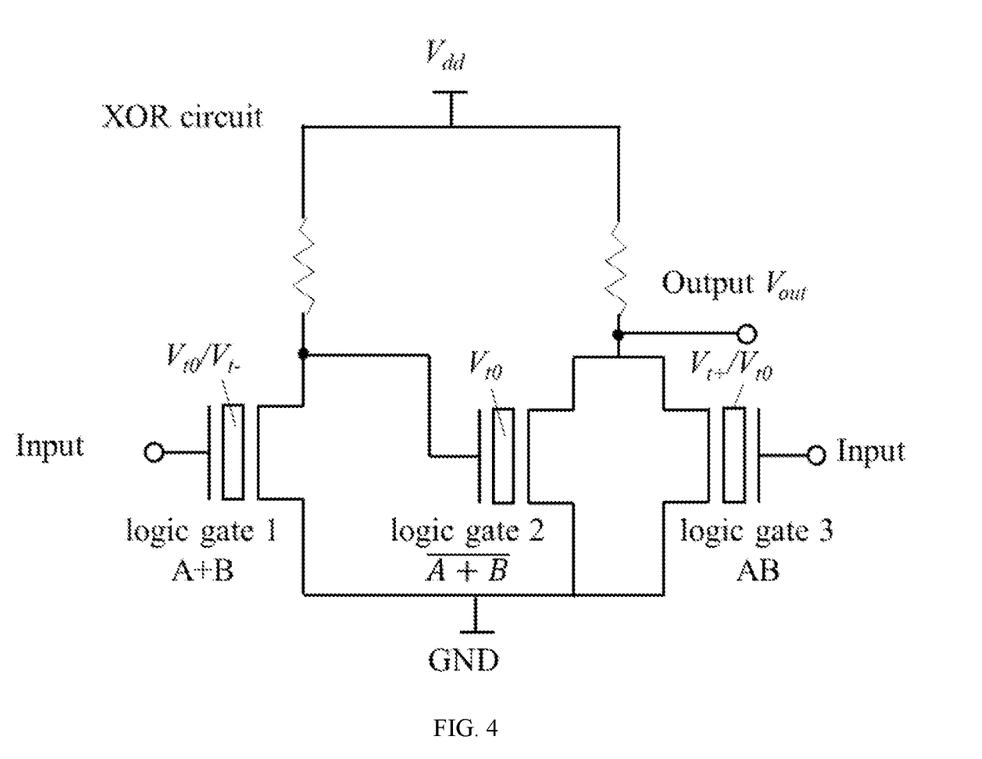
FIG. 4 is a structural diagram of an XOR circuit consisting of cascaded and parallel basic units according to the present disclosure.

As shown in FIG. 4, the present disclosure provides an XOR circuit based on three basic units connected in cascade and parallel. The first-stage basic unit is cascaded with the second-stage basic unit, and the second-stage basic unit is connected in parallel with the third-stage basic unit. The gate of the first-stage ferroelectric-based computing-in-memory transistor and the gate of the third-stage ferroelectric-based computing-in-memory transistor are taken as input ports; the drain voltage of the third-stage computing-in-memory transistor is the output of the in-memory computing logic circuit. The threshold voltage of the first-stage computing-in-memory transistor and the threshold voltage of the third-stage computing-in-memory transistor correspond to the same logic value, which are denoted by A; the gate voltage of the first-stage computing-in-memory transistor and the gate voltage of the third-stage computing-in-memory transistor correspond to the same logic value, which are denoted by B.

For the ferroelectric-based computing-in-memory transistor of the first-stage basic unit, the gate voltage is set to $V_{in+}/V_{in-}$, and the threshold voltage is set to $V_{t0}/V_{t-}$, so that the logic gate 1 is A+B. When the source of the first-stage basic unit is grounded and the port voltage of the first-stage pull resistor is $V_{dd}$, the NOR operation ($\overline{A+B}$) can be implemented. Seeing Table 1 for specific operating conditions.

The output voltage of the ferroelectric-based computing-in-memory transistor of the first-stage basic unit is the gate input of the second-stage basic unit; the threshold voltage of the ferroelectric-based computing-in-memory transistor of the second-stage basic unit is set to $V_{t0}$, which implements the function of the input transmission, that is, the logic gate 2 is $\overline{A+B}$.

When the threshold voltage of the ferroelectric-based computing-in-memory transistor of the third-stage basic unit is set to $V_{t+}/V_{t0}$, the logic gate 3 implements the logic operation of AB.

When the second-stage basic unit is connected in parallel with the third-stage basic unit, the source of the transistor of the parallel structure is grounded and the port voltage connected with the pull resistor is $V_{dd}$, the NOR logic operation of the logic gate 2 and logic gate 3 can be implemented.

Therefore, the whole circuit structure implements the XOR logic operation, and its logic expression is $\overline{(A+B)+AB}$ =A$\overline{B}$+$\overline{A}$B.

The present disclosure has been described in detail above. Compared with the logic circuit structure of the conventional CMOS transistors, the present disclosure can implement more logic operations with fewer transistors; compared with the current Von Neumann computing architecture, it can avoid the delay and power consumption caused by data transmission between storage units and process units, which plays an important role in realizing a new computing architecture, improving computing speed and energy efficiency, and increasing the integrated-circuit density.

What is claimed is:

1. An in-memory computing logic circuit based on computing-in-memory transistors comprises three basic units, wherein a basic unit comprises a computing-in-memory transistor and a pull resistor, the pull resistor is connected in series with the computing-in-memory transistor, a gate of the computing-in-memory transistor is independent, and one end of the pull resistor is connected with a drain of the computing-in-memory transistor;

wherein a drain of a first-stage computing-in-memory transistor is connected with a gate of a second-stage basic unit, so that the first-stage basic unit is cascaded with the second-stage basic unit, the second-stage basic unit and a third-stage basic unit share a pull resistor, a drain of a second-stage computing-in-memory transistor is connected with a drain of a third-stage computing-in-memory transistor, and a source of the second-stage computing-in-memory transistor is connected with a source of the third-stage computing-in-memory transistor, so that the second-stage basic unit and the third-stage basic unit are connected in parallel; a gate of the first-stage computing-in-memory transistor and a gate of the third-stage computing-in-memory transistor are input ports of the in-memory computing logic circuit; and the drain voltage of the third-stage computing-in-memory transistor is an output of the in-memory computing logic circuit;

wherein the second-stage basic unit and the third-stage basic unit are in parallel structure, a port connected with the pull resistor of the parallel structure and a source of the first-stage computing-in-memory transistor are grounded, a source of the computing-in-memory transistor of the parallel structure and the port connected with the first-stage pull resistor are connected to $V_{dd}$; a threshold voltage of the first-stage computing-in-memory transistor is $V_{t0}/V_{t-}$, a threshold voltage of the second-stage computing-in-memory transistor is $V_{t0}$, a threshold voltage of the third-stage computing-in-memory transistor is $V_{t+}/V_{t0}$, and the first-stage basic unit implements NOR logic operation; and wherein the in-memory computing logic circuit implements XNOR logic operation of AB+$\overline{AB}$; the threshold voltage of the first-stage computing-in-memory transistor and the threshold voltage of the third-stage computing-in-memory transistor correspond to a same logic value denoted by A; and a gate voltage of the first-stage computing-in-memory transistor and a gate voltage of the third-stage computing-in-memory transistor correspond to a same logic value denoted by B.

2. The in-memory computing logic circuit according to claim 1, wherein in the basic unit, a threshold voltage ($V_t$) of the computing-in-memory transistor represents the input A of the basic unit; a gate voltage ($V_{in}$) of the computing-in-memory transistor represents the input B of the basic unit, A and B are serial inputs; a drain voltage of the computing-in-memory transistor is an output $V_{out}$ of the basic unit; an end of the pull resistor that is not connected to the computing-in-memory transistor is a port T1, and the source of the computing-in-memory transistor is a port T2.

3. The in-memory computing logic circuit according to claim 2, wherein in the basic unit, the gate voltage ($V_{in}$) and the threshold voltage ($V_t$) of the computing-in-memory transistor satisfy:

$$V_{t+} > V_{in+} > V_{t0} > V_{in-} > V_{t-}$$

where the gate voltage $V_{in}$ is modulated between $V_{in+}$ and $V_{in-}$, and the threshold voltage $V_t$ is modulated between $V_{t+}$, $V_{t0}$ and $V_{t-}$.

4. The in-memory computing logic circuit according to claim 3, wherein the basic unit is configured to implement ten kinds of Boolean logics, consisting of: 1, 0, A, B, $\overline{A}$, $\overline{B}$, AB, A+B, $\overline{AB}$, $\overline{A+B}$, modulating the threshold voltage of the computing-in-memory transistor is capable of changing the AND/OR logic relationship of A and B, and the configuration scheme of the port voltages of the basic unit determines whether the in-memory computing logic circuit has a NOT gate function.

5. The in-memory computing logic circuit according to claim 4, wherein a method for implementing the Boolean logics of the basic unit including:

a) when a port T1 is grounded and a voltage of port T2 is $V_{dd}$, the threshold voltage of the computing-in-memory transistor is $V_{t0}$, the logic operation of 0 or 1 is complemented by modulating the gate voltage: when an applied gate voltage is $V_{in+}$, which is greater than the threshold voltage $V_{t0}$, an output is 1, when the applied gate voltage is $V_{in-}$, which is less than the threshold voltage $V_{t0}$, an output is 0;

b) when the output is irrelated to B, the gate voltage of the computing-in-memory transistor is $V_{in+}$ and the threshold voltage is $V_{t+}/V_{t-}$, the logic operation of A is implemented, the logic value of A is related with a modulation of the threshold voltage: when the threshold voltage is $V_{t+}$, which is greater than the gate voltage the logic value of A is 0, and when the threshold voltage is $V_{t-}$, which is less than the gate voltage the logic value of A is 1; the logic operation of $\overline{A}$ is implemented by adjusting the port voltage: when the port T2 is grounded and the voltage of the port T1 is $V_{dd}$, the NOT operation is performed, an output of Boolean logic is $\overline{A}$;

c) when the output is irrelated to A, the threshold voltage of the computing-in-memory transistor is $V_{t0}$, and the gate voltage is $V_{in+}/V_{in-}$, the logic operation of B is implemented, the logic value of B is related with the modulation of the gate voltage: when the gate voltage is which is greater than the threshold voltage $V_{t0}$, the logic value of B is 1, and when the gate voltage is $V_{in-}$, which is less than the threshold voltage $V_{t0}$, the logic value of B is 0; the logic operation of $\overline{B}$ is implemented by adjusting the port voltage: when the port T2 is grounded and the voltage of the port T1 is $V_{dd}$, the NOT operation is performed, an output of Boolean logic is $\overline{B}$; and d) when the output logic is related to both A and B, the applied gate voltage is $V_{in+}/V_{in-}$, that is, the logic value of B is 1/0:

d1) when the threshold voltage is $V_+/V_{t0}$, that is, the logic value of A is 1/0, two logic operations of $\overline{AB}$, AB are implemented by adjusting the port voltage to configurate the NOT gate function or not; and d2) when the threshold voltage is $V_{t0}/V_{t-}$, the logic value of A is 1/0, two logic operations of $\overline{A+B}$, A+B are implemented by adjusting the port voltage to configurate the NOT gate function or not.

6. The in-memory computing logic circuit according to claim 5, wherein by cascading two basic units, four Boolean logics of A+$\overline{B}$, $\overline{A}$+B, A$\overline{B}$, $\overline{A}$B are implemented, the voltage of port T1 is $V_{dd}$, the port T2 is grounded, and a gate voltage ($V_{in1}$) of a upper-stage computing-in-memory transistor is $V_{in+}/V_{in-}$, a upper-stage basic unit performs the NOT operation, and its output $V_{out1}$ is B; the logic operations of A+$\overline{B}$ are implemented by modulating a threshold voltage of a lower-stage computing-in-memory transistor; a configuration scheme of port voltages of a lower-stage basic unit determines whether to perform the NOT operation to implement the logic operations of $\overline{A}$+B, $\overline{A}$B.

7. The in-memory computing logic circuit according to claim 6, wherein a configuration of the NOT gate function achieved by adjusting the port voltage includes: when port T1 is grounded and the voltage of port T2 is $V_{dd}$, the basic unit has no NOT gate function, and when the voltage of port T1 is $V_{dd}$ and port T2 is grounded, the basic unit has a NOT gate function.

8. The in-memory computing logic circuit according to claim 1, wherein the computing-in-memory transistor is a non-volatile three-terminal memory transistor.

9. An in-memory computing logic circuit based on computing-in-memory transistors comprising three basic units, wherein the basic unit comprises a computing-in-memory transistor and a pull resistor, the pull resistor is connected in series with the computing-in-memory transistor, and the gate of the computing-in-memory transistor is independent, one end of the pull resistor is connected with the drain of the computing-in-memory transistor;

wherein a drain of a first-stage computing-in-memory transistor is connected with the gate of a second-stage basic unit, so that a first-stage basic unit is cascaded with the second-stage basic unit; the second-stage basic unit and a third-stage basic unit share a pull resistor, a drain of the second-stage computing-in-memory transistor is connected with a drain of a third-stage computing-in-memory transistor, and a source of the second-stage computing-in-memory transistor is connected with a source of the third-stage computing-in-memory transistor, so that the second-stage basic unit and the third-stage basic unit are connected in parallel; the gate of the first-stage computing-in-memory transistor and the gate of the third-stage computing-in-memory transistor are input ports of the in-memory computing logic circuit, the drain voltage of the third-stage computing-in-memory transistor is the output of the in-memory computing logic circuit;

wherein the second-stage basic unit and the third-stage basic unit are in parallel structure; a source of the computing-in-memory transistor of the parallel structure and a source of the first-stage computing-in-memory transistor are grounded, a port connected with a pull resistor of the parallel structure and a port connected with a first-stage pull resistor are connected to $V_{dd}$, a threshold voltage of the first-stage computing-in-memory transistor is $V_{t0}/V_{t-}$, a threshold voltage of the second-stage computing-in-memory transistor is $V_{t0}$, a threshold voltage of the third-stage computing-in-memory transistor is $V_{t+}/V_{t0}$, the first-stage basic unit implements NOR logic operation; and wherein the in-memory computing logic circuit implements XOR logic operation of $\overline{A}B+A\overline{B}$; the threshold voltage of the first-stage computing-in-memory transistor and the threshold voltage of the third-stage computing-in-memory transistor correspond to a same logic value denoted by A, a gate voltage of the first-stage computing-in-memory transistor and a gate voltage of the third-stage computing-in-memory transistor correspond to a same logic value denoted by B.

* * * * *